(12) United States Patent
Yang (10) Patent No.: US 7,625,815 B2
(45) Date of Patent: Dec. 1, 2009

(54) REDUCED LEAKAGE INTERCONNECT STRUCTURE

(75) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 196 days.

(21) Appl. No.: 11/554,612

(22) Filed: Oct. 31, 2006

(65) Prior Publication Data

US 2008/0102599 A1    May 1, 2008

(51) Int. Cl.
    *H01L 21/00* (2006.01)

(52) U.S. Cl. .................. 438/612; 438/614; 438/618; 438/637; 438/672; 438/686; 257/E21.175; 257/E21.508; 257/E21.575; 257/E21.579; 257/E21.586; 257/E23.145; 257/E23.152; 257/E23.169

(58) Field of Classification Search .............. 438/631, 438/633, 634, 650, 612, 614–619, 637–639, 438/672–686; 257/642, 649, 752, 759, 762, 257/774, E21.011, 21, 576, 21.647, E21.175, 257/508, 575, 577, 579, 585, 586, E23.145, 257/152, 169
See application file for complete search history.

(56) References Cited

U.S. PATENT DOCUMENTS

| | | | |
|---|---|---|---|
| 5,098,860 A | 3/1992 | Chakravorty et al. | |
| 5,789,320 A * | 8/1998 | Andricacos et al. | 438/678 |
| 5,930,669 A | 7/1999 | Uzoh | |
| 5,933,753 A | 8/1999 | Simon et al. | |
| 6,200,890 B1 | 3/2001 | Chen | |
| 6,331,481 B1 * | 12/2001 | Stamper et al. | 438/626 |
| 6,340,638 B1 * | 1/2002 | Chen et al. | 438/687 |
| 6,368,953 B1 * | 4/2002 | Petrarca et al. | 438/625 |
| 6,383,920 B1 * | 5/2002 | Wang et al. | 438/639 |
| 6,417,095 B1 * | 7/2002 | Chen | 438/633 |
| 6,429,519 B1 | 8/2002 | Uzoh | |
| 6,492,224 B1 * | 12/2002 | Jao | 438/241 |
| 6,605,534 B1 * | 8/2003 | Chung et al. | 438/674 |
| 6,720,245 B2 * | 4/2004 | Stucchi et al. | 438/614 |
| 6,759,332 B2 * | 7/2004 | Clevenger et al. | 438/687 |
| 6,784,088 B2 * | 8/2004 | Edelstein et al. | 438/612 |
| 6,825,561 B1 | 11/2004 | Agarwala et al. | 257/752 |
| 2004/0142561 A1 | 7/2004 | Wu et al. | |
| 2005/0009339 A1 * | 1/2005 | Park | 438/687 |
| 2006/0216926 A1 * | 9/2006 | Ye et al. | 438/629 |
| 2008/0122045 A1 * | 5/2008 | Yang et al. | 257/642 |
| 2009/0160060 A1 * | 6/2009 | Hong | 257/762 |

* cited by examiner

*Primary Examiner*—Michael S Lebentritt
(74) *Attorney, Agent, or Firm*—Ian D. MacKinnon

(57) ABSTRACT

An improved semiconductor device interconnect structure comprising a dielectric layer recessed with respect to the conductive interconnect features. This structure and method reduces embedded metallic residues from CMP scratches and metal cap applications and provides improved mechanical integrity at the capping layer/liner/dielectric interface.

12 Claims, 11 Drawing Sheets

Structure
Embodiment- 1

FIG. 7
Structure Embodiment-1

FIG. 8
Structure Embodiment-2

FIG. 12 Structure Embodiment- 3

FIG. 13 Structure Embodiment- 4

REDUCED LEAKAGE INTERCONNECT STRUCTURE

BACKGROUND OF THE INVENTION

The present invention relates to semiconductor integrated circuits (ICs), and more particularly to a back-end-of-the-line (BEOL) interconnect structure.

The continuous scaling to smaller dimensions and the introduction of low-k dielectrics in copper interconnects have caused reliability issues to become a greater concern in addition to increasing process complexity. Chemical Mechanical Polish (CMP) residues may cause wire to wire electrical shorts. This problem is becoming more serious as the wire to wire spacing is decreased.

It has been observed that post CMP Cu scratches and/or residue between interconnects are a major cause of dielectric breakdown failure. This dielectric breakdown failure is a reliability issue which is getting worse as IC critical dimensions continue to scale down.

In semiconductor interconnect structures, electromigration (EM) has been identified as a metal failure mechanism. EM is a serious reliability concern for very large scale integrated (VLSI) circuits. Voids are created inside the metal conductor of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect. This can result in a circuit dead opening.

Metal cap interconnect systems are known to have better electromigration resistance as compared to conventional dielectric cap interconnect systems. The Cu/metal interface has better adhesion strength than the Cu/dielectric interface. This results in better electromigration resistance in the Cu/metal capping layer system. Selective Co alloy deposition on Cu interconnects has been demonstrated to have higher electromigration resistance than the Cu/dielectric capping layer system. A problem with selective Co deposition is observed Co residues between interconnects. Metallic residues from metal cap deposition processes have caused wire to wire shorts and are a problem with implementing a metal cap interconnect system for high volume manufacturing.

In addition to the reliability issues caused by the metal residues, either from CMP scratches or metal cap deposition, weak mechanical strength at the cap/dielectric/barrier interface also leads to Cu diffusion into the dielectric which causes circuit reliability degradation.

Figure 1:
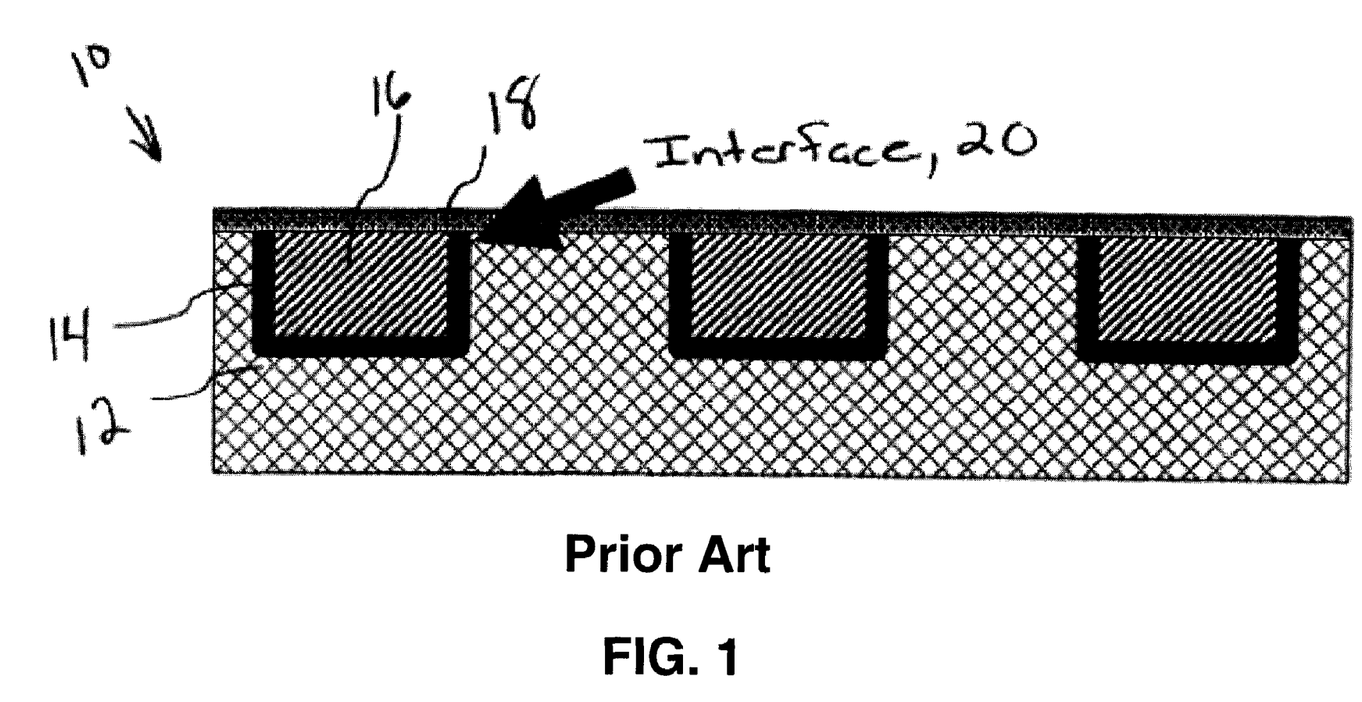
FIG. 1 is a schematic cross-sectional view illustrating a conventional interconnect structure.

FIG. 1 is a cross sectional view of a conventional interconnect structure illustrating the mechanically weak interface. Specifically, the interconnect structure 10 shown in FIG. 1 comprises a dielectric material 12 having a dielectric constant of approximately 4.0 or less. Embedded within the dielectric material 12 is a conductive material 16, preferably Cu, that is separated from the dielectric material 12 by a diffusion barrier 14. A capping layer 18 is located atop the dielectric material 12 as well as upper portions of the diffusion barrier 14 and on the conductive material 16. The conventional interconnect structure 10 is mechanically weak at the triple interface that is formed between the capping layer 18/dielectric material 12/diffusion barrier 14. The mechanically weak interface is denoted by reference numeral 20.

In addition to the reliability issues caused by the mechanically weak interface, conductive material 16 eventually diffuses into the dielectric material 12 and causes reliability degradation of the circuit. The diffusion of conductive material to the dielectric material 12 occurs readily in the absence of the diffusion barrier 14 under the influence of an electrical field. Similarly, it has also been observed that the conductive material 16, particularly Cu ions, can diffuse into the dielectric material 12 along the conductive material 16/capping layer 18 interface under normal circuit operations.

An object of the present invention is to provide a novel interconnect structure with higher mechanical strength at the cap/dielectric/barrier interface and enhanced circuit reliability.

Another object of the present invention is to provide a novel interconnect structure with high dielectric breakdown resistance. Another object of the present invention is to provide fabrication methods which are compatible with current BEOL processes without adding extra masking steps or increased cost.

BRIEF SUMMARY OF THE INVENTION

The present invention provides a semiconductor device comprising; a first dielectric layer with conductive interconnects partially embedded therein; a diffusion barrier layer partially surrounding the conductive interconnects; and a dielectric capping layer in contact with the dielectric layer and the non-embedded portion of the conductive interconnects.

The semiconductor device further comprises a second dielectric layer in contact with the dielectric capping layer. The first dielectric layer preferably has a dielectric constant that is approximately 4.0 or less. The first dielectric layer thickness is approximately 500 Å to approximately 10,000 Å.

The diffusion barrier layer is preferably Ta, TaN, Ti, TiN, Ru, RuN, RuTa, RuTaN, W, or WN. The conductive interconnects are preferably Cu or CuAl. The dielectric capping layer is preferably SiC, $Si_4NH_3$, $SiO_2$, a carbon doped oxide, a nitrogen or hydrogen doped silicon carbide SiC(N,H). The dielectric capping layer preferably has a thickness of approximately 15 nm to approximately 55 nm.

The present invention further provides a semiconductor device comprising; a first dielectric layer with conductive interconnects partially embedded therein; a diffusion barrier layer partially surrounding the conductive interconnects; a dielectric capping layer in contact with the dielectric layer and the non-embedded portion of the conductive interconnects; and a metal capping layer in contact with a portion of the conductive interconnects and a portion of the dielectric capping layer.

The semiconductor device further comprises a second dielectric layer in contact with the dielectric capping layer. The metal capping layer is preferably Ta, Ru, CoW, CoP, CoB, CoWP, CoMo and CoRe. The metal capping layer preferably has a thickness of approximately 1 nm to approximately 20 nm.

The present invention further provides a method for forming a semiconductor device, comprising the steps of: providing a sacrificial dielectric layer deposited on a first dielectric layer; forming features in the sacrificial dielectric layer and the first dielectric layer; depositing conductive material in the features; planarizing the conductive material and the sacrificial dielectric layer to form conductive interconnects; removing the sacrificial dielectric layer; and depositing a dielectric capping layer on the first dielectric layer and the interconnect features.

The method further provides the step of depositing a second dielectric layer on the dielectric capping layer. The features comprise a combination of lines and vias. The conductive material is preferably deposited by atomic layer deposition, chemical vapor deposition, plasma enhanced chemical vapor deposition, sputtering, chemical solution deposition or plating.

The sacrificial dielectric layer is preferably removed using acids such as HF, HCl, $H_2SO_4$ or $HNO_3$.

The present invention also provides a method for forming a semiconductor device, comprising the steps of: providing a sacrificial dielectric layer deposited on a first dielectric layer; forming features in the sacrificial dielectric layer and the first dielectric layer; depositing conductive material in the features; planarizing the conductive material and the sacrificial dielectric layer to form conductive interconnects; depositing a metal capping layer on the exposed portions of the conductive interconnects; removing the sacrificial dielectric layer; and depositing a dielectric capping layer on the first dielectric layer and the metal capping layer.

The method further provides the step of depositing a second dielectric layer on the dielectric capping layer. The metal capping layer is preferably selectively deposited on the conductive interconnects by electroless plating.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention provides an interconnect structure comprising a recessed dielectric layer which reduces embedded metallic residues from CMP scratches and metal cap applications and provides improved mechanical integrity at the cap/liner/dielectric junction.

According to the present invention, a semiconductor interconnect structure is provided that includes a new capping layer/dielectric material interface which is embedded inside the dielectric material. In particular, the new interface is located in the upper surface of a dielectric material that is adjacent to a conductive region or feature. The presence of the dielectric material that is adjacent to the conductive region or feature provides a new interface that has a high mechanical strength and improved reliability. Further, the new interface provided in the present invention is free of metal residues and has a high dielectric breakdown resistance which is important for future technology extendibility. Further, the new interface is provided utilizing processing steps which are compatible with existing interconnect technology without added cost.

The present invention is now described in greater detail by referring to the following discussion and drawings that accompany the present application. The drawings of the present application, which are referred to in greater detail herein below, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
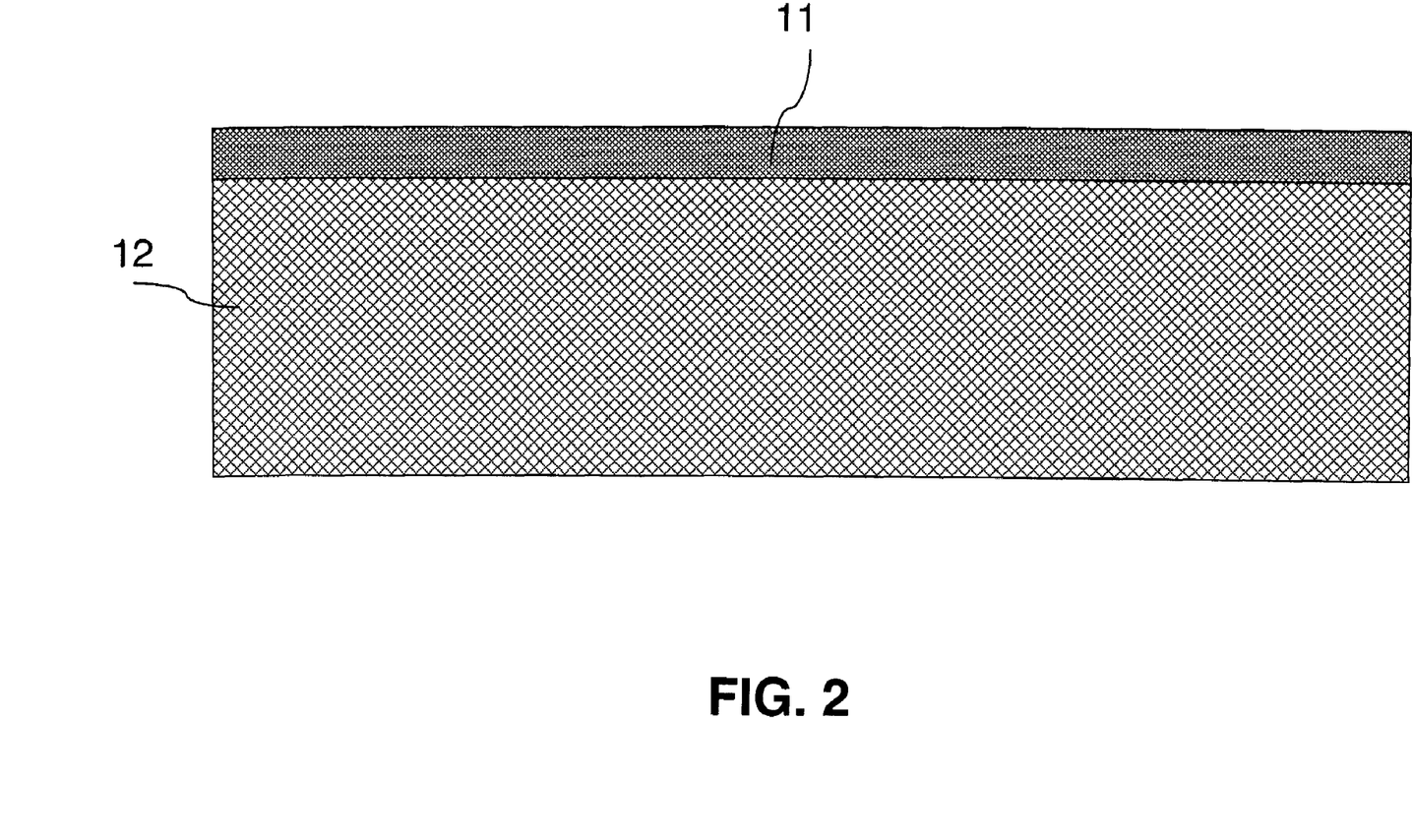
FIGS. 2 through 13 are schematic cross-sectional views illustrating preferred structures according to the present invention.

Referring to FIG. 2 there is described a first embodiment of the present invention for dielectric cap applications. A sacrificial dielectric layer 11 is deposited on an inter-layer dielectric (ILD) layer 12. In a preferred embodiment the sacrificial dielectric layer 11 is $Si_3N_4$, SiC or $SiO_2$. In a preferred embodiment the ILD layer is a low-k material such as SiCOH or SiLK.

The dielectric material 12 typically has a dielectric constant that is approximately 4.0 or less, with a dielectric constant of approximately 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0.

The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combinations including multilayers thereof. When the substrate is a conducting material, the substrate may include, for example, polySi, an elemental metal, alloys of elemental metals, a metal silicide, a metal nitride or combinations including multilayers thereof. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a lower interconnect level of a multilayered interconnect structure.

Referring again to FIG. 2, the sacrificial dielectric film 11 preferably has a thickness between 100 Å and 800 Å, and the ILD layer 12 preferably has a thickness between 500 Å and 10,000 Å.

Figure 3:
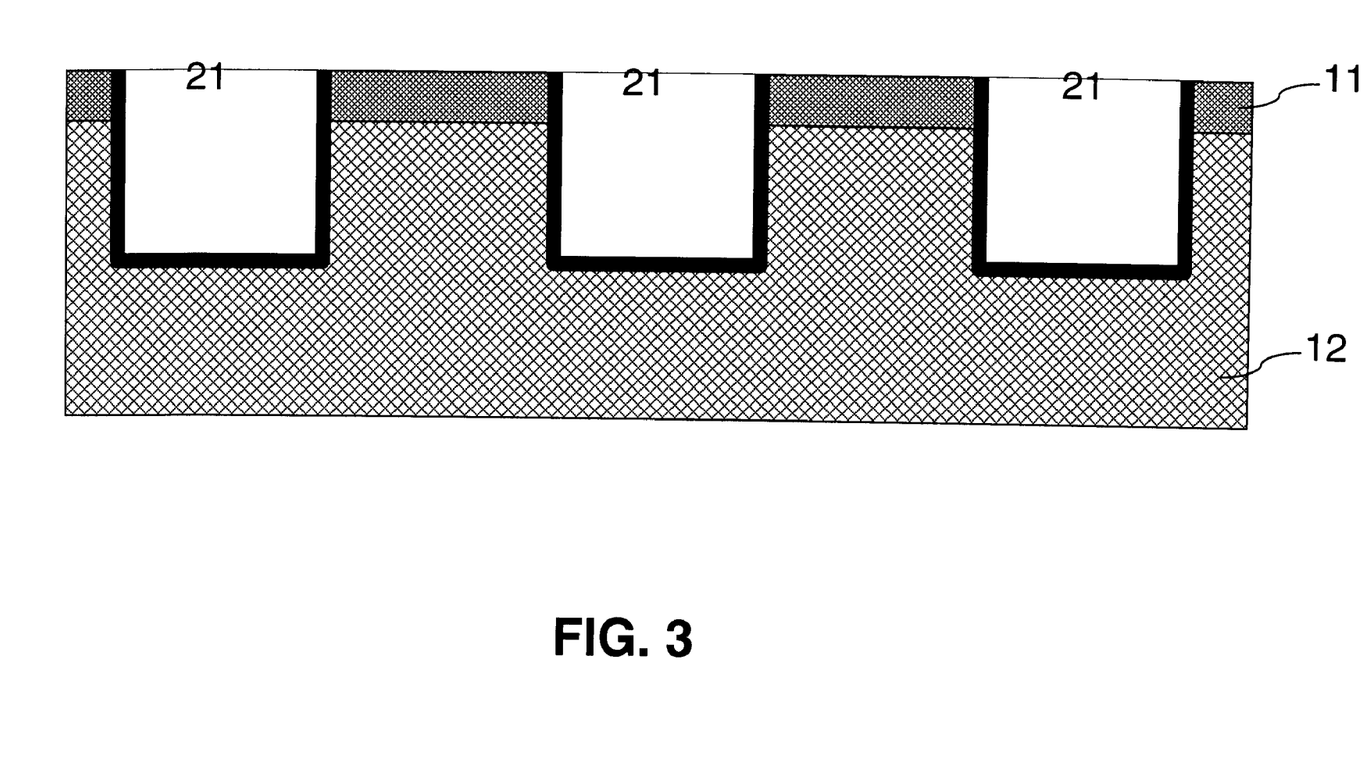

Referring to FIG. 3 there is illustrated patterned features 21 created by conventional lithography and etching processes. The lithographic step includes applying a photoresist to the surface of the sacrificial dielectric layer 11, exposing the photoresist to a desired pattern of radiation, and developing the exposed resist utilizing a conventional resist developer. The etching step may comprise a dry etching process, a wet chemical etching process or a combination thereof.

The term "dry etching" is used herein to denote an etching technique such as reactive-ion etching, ion beam etching, plasma etching or laser ablation. During the etching process, the pattern is first transferred to the sacrificial dielectric layer 11 and then into the dielectric material 12. The patterned photoresist is typically, but not necessarily always, removed from the structure after the pattern has been transferred into the sacrificial dielectric layer 11.

The at least one opening 21 formed into the dielectric material 12 may comprise a line opening, a via opening or a combination of a line opening and a via opening. A single damascene or dual damascene process can be used as appropriate depending on the type of opening being formed. A first via and then line opening process may be used, or a first line and then via opening process may be used.

Figure 4:
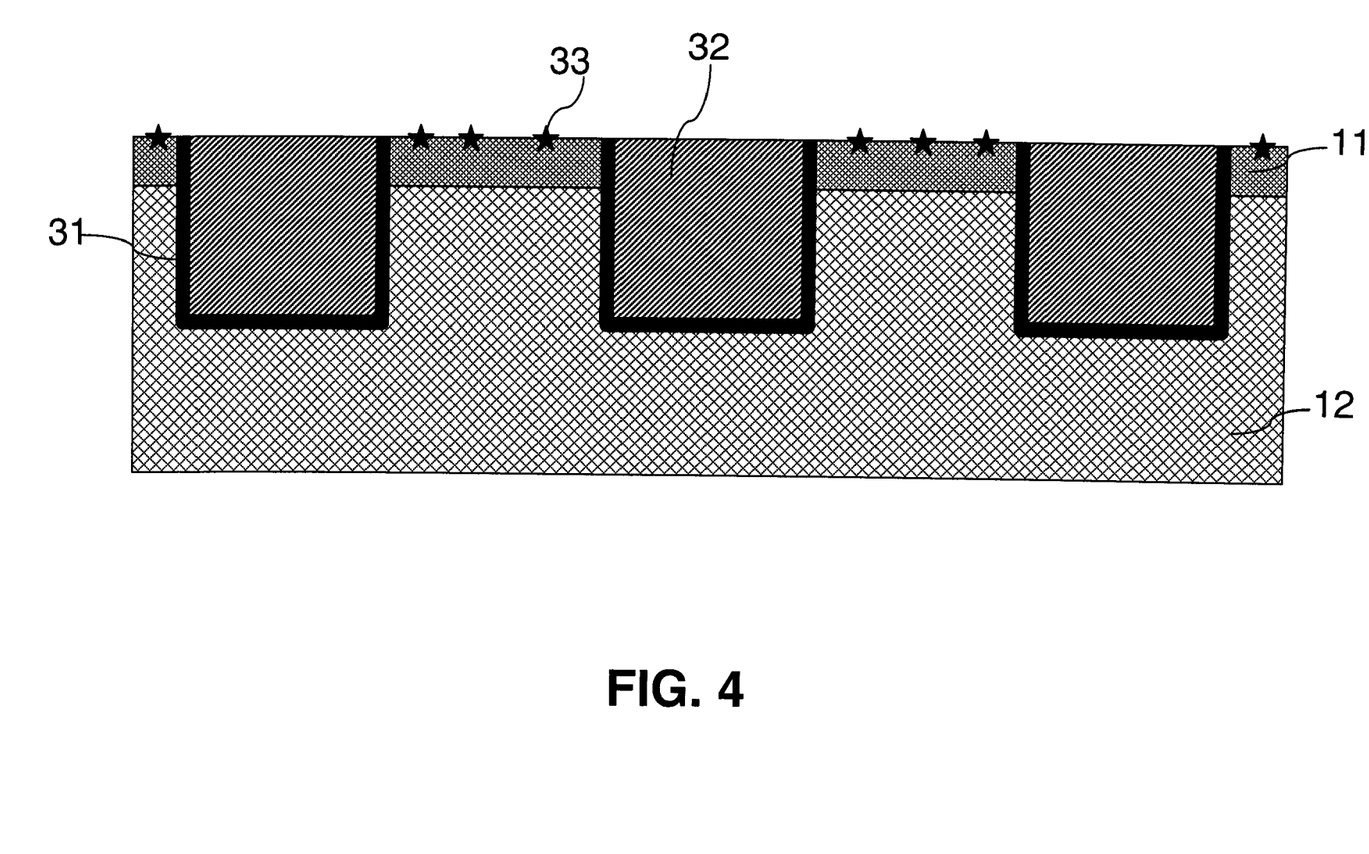

Referring now to FIG. 4 the structure is shown post metallization to fill the patterned features and then CMP to planarize and isolate the conductive interconnects 32. Deposited diffusion barrier material 31 is preferably Ta, TaN, Ti, TiN, Ru, RuN, RuTa, RuTaN, W, WN or any other material that can serve as a barrier to prevent conductive material from diffusing there through. Deposition is formed by a deposition process such as, for example, atomic layer deposition (ALD), chemical vapor deposition (CVD), plasma enhanced chemical vapor deposition (PECVD), sputtering, chemical solution deposition, or plating. The conductive interconnect 32 is preferably Cu or CuAl. FIG. 4 illustrates typical interconnect scratches or residue 33, for example Cu residue, on the sacrificial dielectric layer 11.

Figure 5:
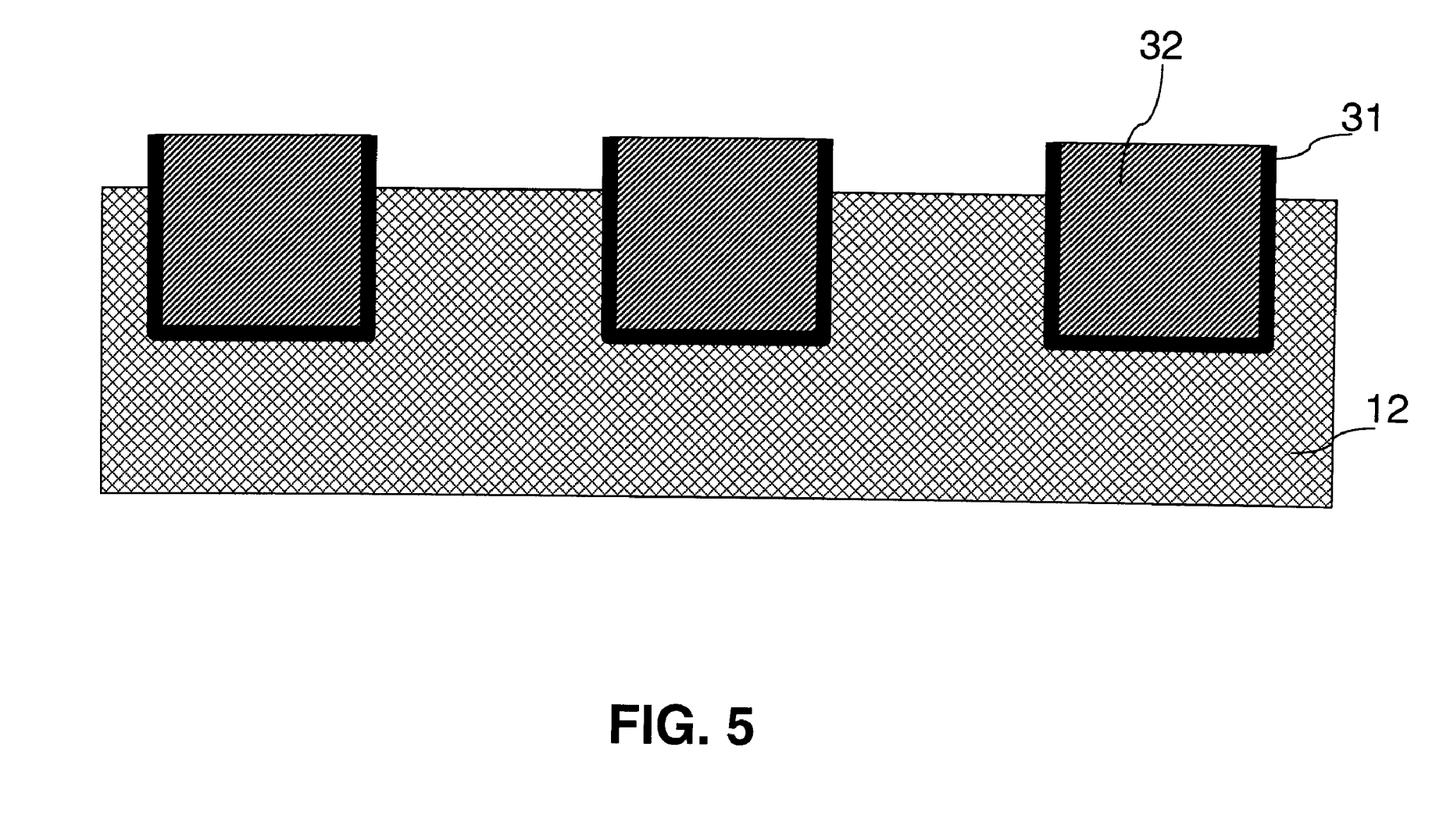

Referring now to FIG. 5 the structure is shown after removing the sacrificial dielectric layer 11 using dilute HF, or mixtures of acids such as HCl, $H_2SO_4$ and $HNO_3$. This process step also removes the Cu residues 33 from the dielectric surface. The interconnect structures 32 are now partially protruding above the dielectric material 12.

Figure 6:
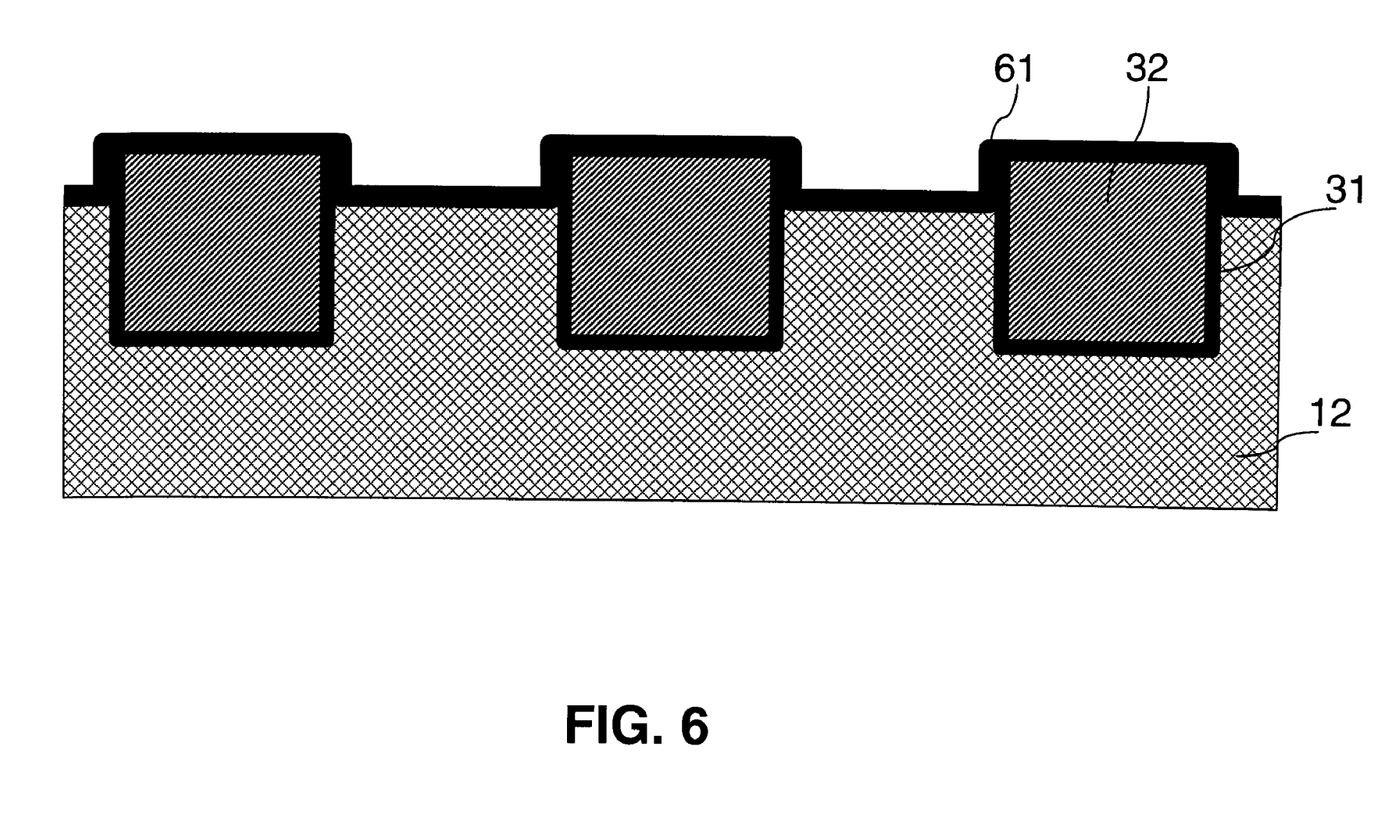

Referring now to FIG. 6 there is illustrated the deposition of a dielectric capping layer 61. This layer is preferably a thin layer and is conformal to and overlies the conductive interconnect 32 and the exposed diffusion barrier material 31 extending above the base dielectric 12. The dielectric capping layer 61 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 61 may vary depending on the technique used to form the same as well as the material make-up of the layer. Typically, the dielectric capping layer 61 has a thickness from approximately 15 to approximately 55 nm, with a thickness from approximately 25 to approximately 45 nm being more typical. In a preferred embodiment the dielectric capping layer 61 is $Si_3N_4$, SiC, SiCN, SiCH or SiC(N,H).

Figures 7, 8:
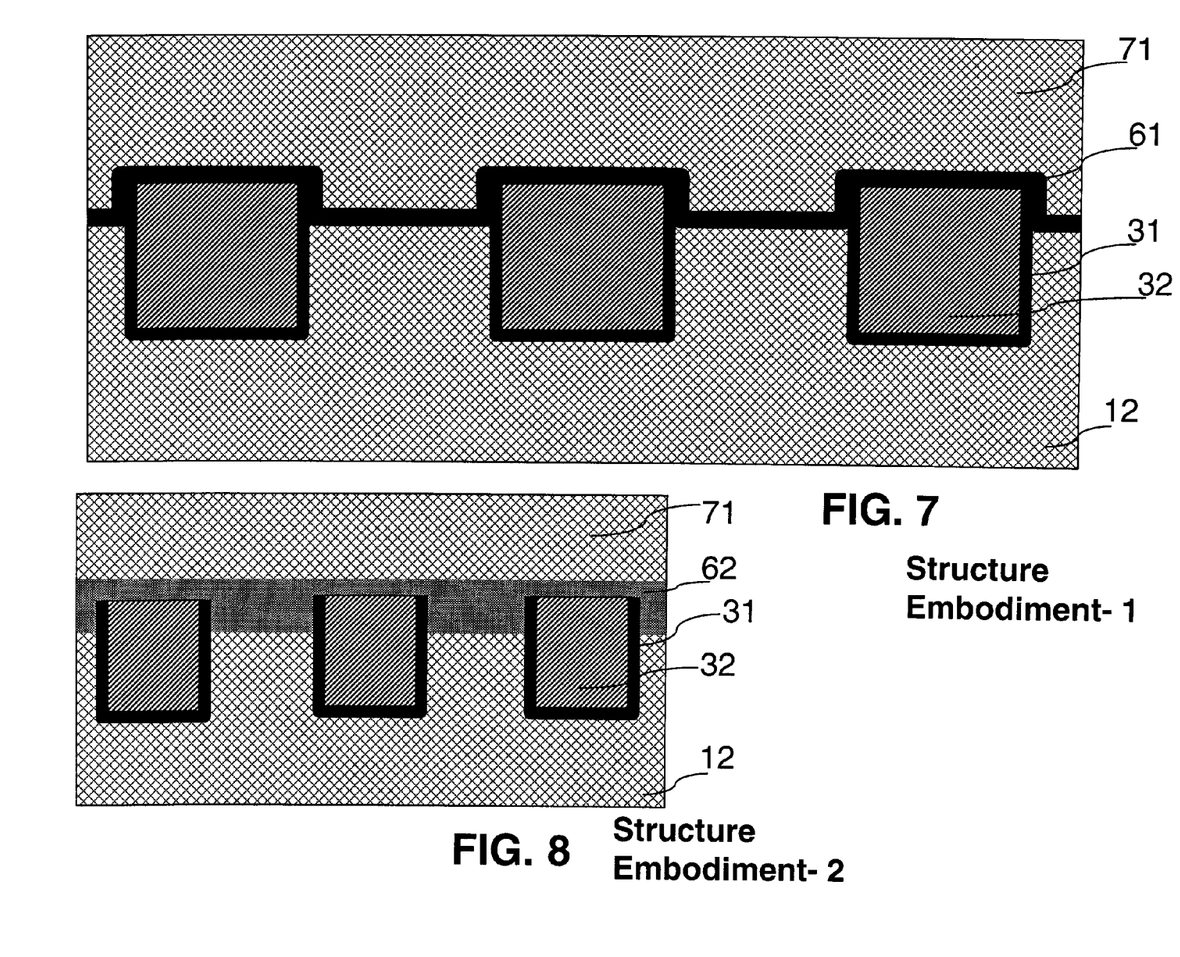

Referring now to FIG. 7 there is illustrated the deposition of a second dielectric layer 71 for the next level dielectric build. The upper dielectric material 71 may comprise the same or different dielectric material as that of the dielectric material 12. The upper dielectric material 71 may be formed utilizing one of the above mentioned deposition processes and it can be processed to have conductive regions or features embedded therein utilizing the processing steps mentioned above.

Referring now to FIG. 8 there is illustrated another preferred embodiment of the present invention. This alternative structure shows a "thick" dielectric capping layer 62 followed by a CMP process.

Figure 9:
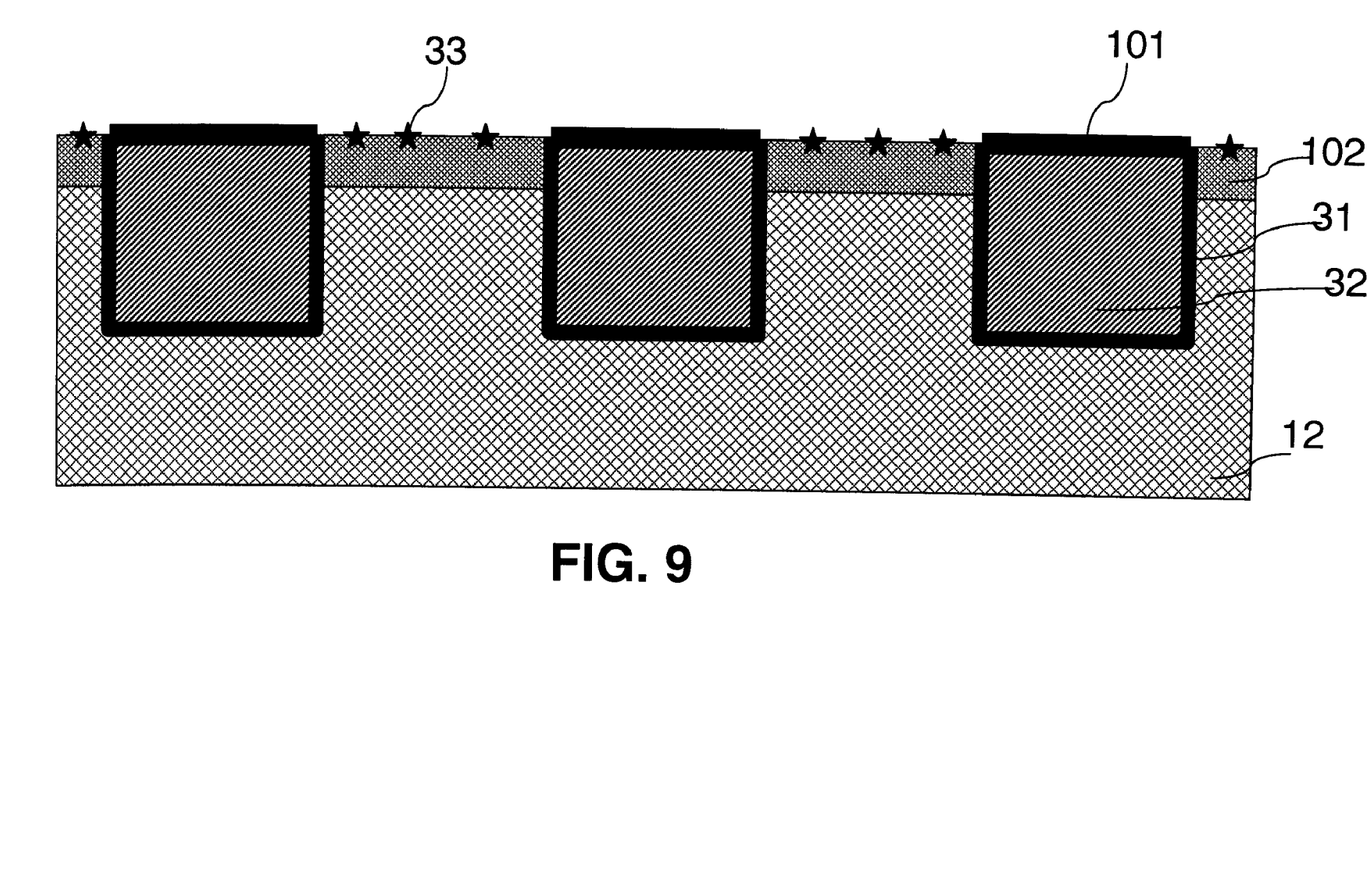

Referring now to FIG. 9 there is described another embodiment of the present invention for metal cap applications. As in the prior dielectric cap application, a sacrificial dielectric layer 102 is deposited on an inter-layer dielectric (ILD) layer 12. In a preferred embodiment the sacrificial dielectric layer 102 is $Si_3N_4$, SiC or SiO2. In a preferred embodiment the ILD layer is a low-k material such as SiCOH or SiLK.

Preferably, the sacrificial dielectric layer 102 has a thickness between 100 Å and 800 Å, and the ILD layer 12 preferably has a thickness between 500 Å and 10,000 Å. In FIG. 9 the structure is shown post metallization and CMP. Deposited diffusion barrier material 31 is preferably Ta(N), Ti(N), Ru or W(N). The conductive interconnect 32 is preferably Cu or CuAl. In this embodiment a metal cap layer 101 is deposited on the conductive interconnects 32 after CMP.

The metal cap layer 101 may be comprised of any metallic capping material including, but not limited to Ta, Ru and Co-containing materials. The term "Co-containing materials" is used herein to denote elemental Co alone or elemental Co and at least one of P and B. Optionally, W may be used in the Co-containing materials. When Co-containing materials are used as the metal cap 101, the metal cap 101 may comprise Co, CoP, CoW, CoB or CoWP. Typically, CoP or CoWP are preferred Co-containing materials for the metal cap layer 101.

The thickness of the metal cap 101 formed may vary depending on the exact conditions of the technique used in forming the same. In general, the thickness of the metal cap 101 is from approximately 1 to approximately 20 nm, with a thickness from approximately 4 to approximately 10 nm being even more typical. The metal cap 101 may be formed by a selective deposition process such as, for example, an electroless plating process. Alternatively, the metal cap may be formed by a non-selective deposition process followed by lithography and etching.

When an electroless plating process is employed, a redox reaction involving the oxidation of one or more soluble reducing agent(s) and the reduction of one or more metallic ions occurs on the surface of a substrate. For many metals including Cu, Ni, Co, Au, Ag Pd, Rh, Pt, the freshly deposited surface is sufficiently catalytic for the process to continue.

A suitable electroless plating system used in this invention is based on the use of the hypophosphite reducing agent. In this system, a mixture of hypophosphite ions and cobalt ions is made together with citrate stabilizing agent, at a suitable pH and temperature (usually between 65° C. to 75° C.). When the activated catalyzed substrate described above is immersed on this plating bath, the following reaction occurs on the substrate:

The Co metal is then deposited selectively on top of the conductive material of conductive region 32. The metal deposited by this reaction, can be either Co, CoP, CoWP, CoB or CoWB, depending on the composition of the plating bath solution.

FIG. 9 illustrates typical interconnect scratches or residues 33, for example Cu, caused by CMP and metal residues resulting from metal cap deposition on the sacrificial dielectric film 102.

Figure 10:
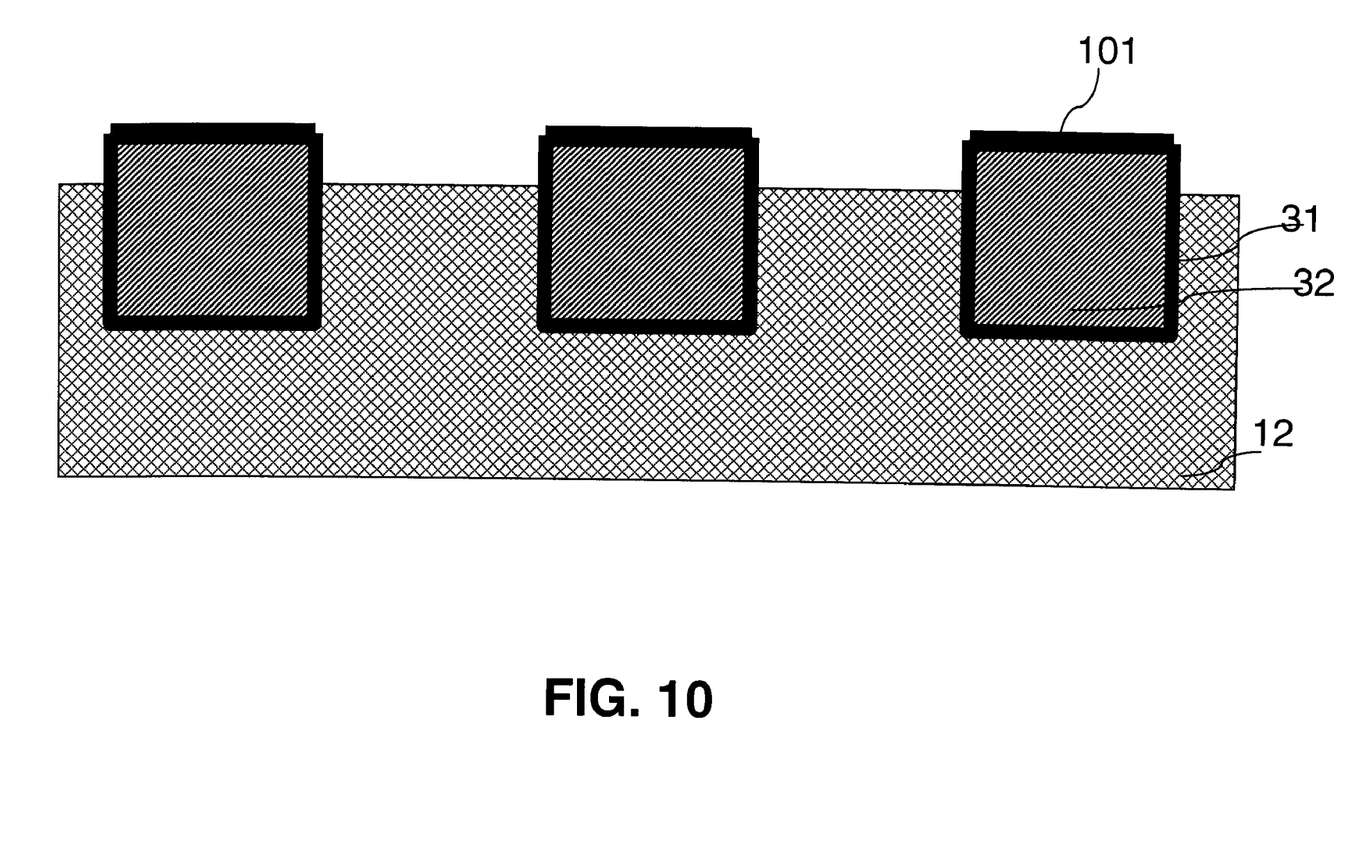

Referring now to FIG. 10 the structure is shown after removing the sacrificial dielectric layer 102 using dilute HF, or mixtures of acids such as HCl, $H_2SO_4$ and $HNO_3$. By removing the dielectric layer 102 after selective metal cap 101 deposition, possible metal residues from the selective metal cap deposition can be removed from the dielectric surface. This process step also removes the Cu residues 33 from the dielectric surface.

Figure 11:
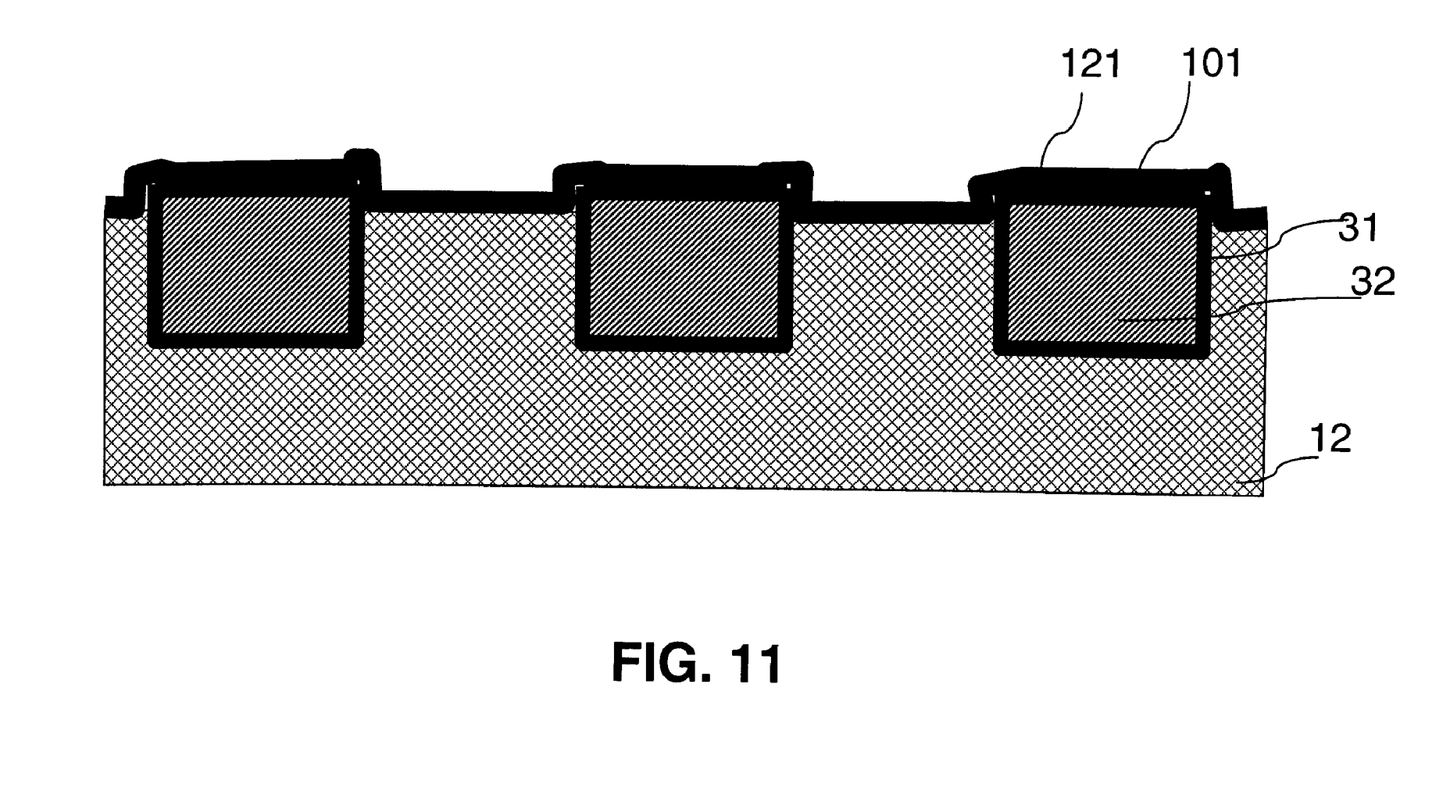

Referring now to FIG. 11 there is illustrated the deposition of a dielectric capping layer 121 over the ILD layer 12 and metal capping layer 101. In a preferred embodiment the dielectric capping layer 121 is $Si_3N_4$, SiC, SiCN or SiCH.

Figures 12, 13:
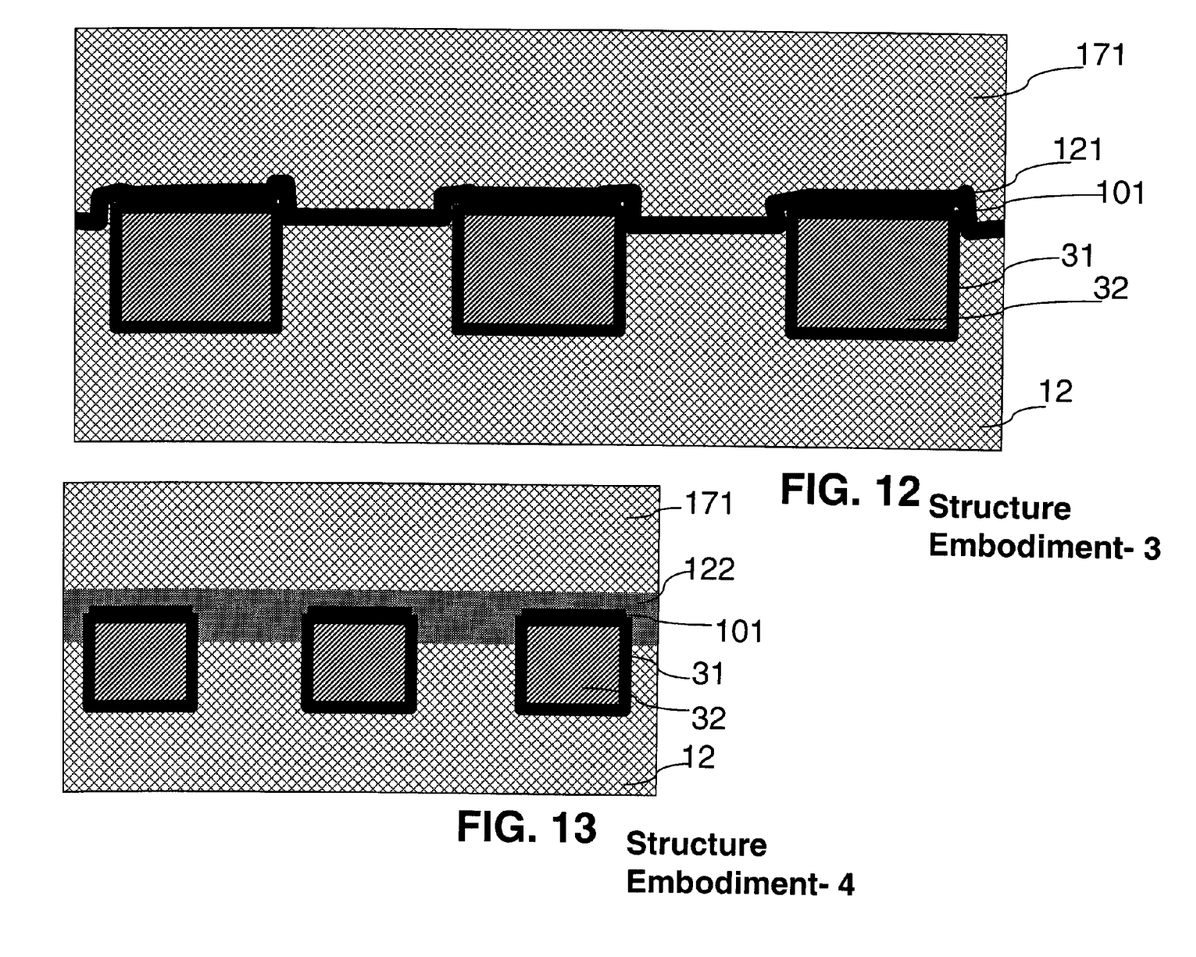

Referring now to FIG. 12 there is illustrated the deposition of a second dielectric layer 171 for the next level dielectric build.

Referring to FIG. 13 there is illustrated another preferred embodiment of the present invention. This alternative structure shows a "thick" dielectric capping layer 122 followed by a CMP process.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A semiconductor device comprising;
 a first dielectric layer with at least one conductive interconnect partially embedded therein;
 a diffusion barrier layer partially surrounding said at least one conductive interconnect protruding above said first dielectric layer; and
 a metal capping layer in contact with said dielectric layer and said protruding portion of said diffusion barrier layer and said at least one conductive interconnect.

2. The semiconductor device of claim 1 further comprising a second dielectric layer in contact with said metal capping layer.

3. The semiconductor device of claim 1 wherein said first dielectric layer has a dielectric constant that is approximately 4.0 or less.

4. The semiconductor device of claim 1 wherein said first dielectric layer thickness is approximately 500 Å to approximately 10,000 Å.

5. The semiconductor device of claim 1 wherein said diffusion barrier layer is comprised of a material selected from the group consisting of Ta, TaN, Ti, TiN, Ru, RuN, RuTa, RuTaN, W, and WN.

6. The semiconductor device of claim 1 wherein said at least one conductive interconnect is comprised of a material selected from the group consisting of Cu and CuAl.

7. The semiconductor device of claim 1 further comprising a dielectric capping layer in contact with said metal capping layer comprised of a material selected from the group consisting of SiC, Si4NH3, SiO2, a carbon doped oxide, a nitrogen and hydrogen doped silicon carbide SiC(N,H).

8. The semiconductor device of claim 7 wherein said dielectric capping layer has a thickness of approximately 15 nm to approximately 55 nm.

9. A semiconductor device comprising;
 a first dielectric layer with at least one conductive interconnect partially embedded therein;
 a diffusion barrier layer partially surrounding said at least one conductive interconnect protruding above said first dielectric layer;
 a dielectric capping layer in contact with said dielectric layer and said protruding portion of said diffusion barrier layer and said at least one conductive interconnect; and
 a metal capping layer in contact with a portion of said at least one conductive interconnect and a portion of said dielectric capping layer.

10. The semiconductor device of claim 9 further comprising a second dielectric layer in contact with said dielectric capping layer.

11. The semiconductor device of claim 9 wherein said metal capping layer is comprised of a material selected from the group consisting of Ta, Ru, CoW, CoP, CoB, CoWP, CoMo and CoRe.

12. The semiconductor device of claim 9 wherein said metal capping layer has a thickness of approximately 1 nm to approximately 20 nm.

* * * * *